United States Patent [19]

Goldman

[11] 3,820,235

[45] June 28, 1974

[54] GUARD RING STRUCTURE FOR MICROWAVE SCHOTTKY DIODE

[75] Inventor: Richard L. Goldman, Sunnyvale, Calif.

[73] Assignee: Philco-Ford Corporation, Blue Bell, Pa.

[22] Filed: May 21, 1973

[21] Appl. No.: 361,873

[52] U.S. Cl. ........................ 29/578, 29/580, 29/590, 148/175

[51] Int. Cl. ............................................ B01j 17/00

[58] Field of Search ............. 29/578, 580, 590, 589; 148/175; 317/235 UA

[56] References Cited

UNITED STATES PATENTS

| | | | |
|---|---|---|---|
| 3,265,542 | 8/1966 | Hirshon | 317/235 |
| 3,571,916 | 3/1971 | Landkammer | 29/578 |
| 3,585,469 | 6/1971 | Jager | 317/235 UA |
| 3,742,317 | 6/1973 | Shao | 317/235 UA |

*Primary Examiner*—W. Tupman

*Attorney, Agent, or Firm*—Robert D. Sanborn; Gail W. Woodward

[57] ABSTRACT

A process for automatically establishing a P-N junction guard ring during epitaxial deposition of semiconductor material suitable for Schottky barrier diode formation. Since no separate diffusion step is required for guard ring formation, the process is simplified and a very narrow guard ring can be employed. This is highly useful in very small diode structures, such as are employed at the higher microwave frequencies.

4 Claims, 11 Drawing Figures

GUARD RING STRUCTURE FOR MICROWAVE SCHOTTKY DIODE

BACKGROUND OF THE INVENTION

Schottky diodes in their most common form employ a metallic area contact directly on a semiconductor surface. When a suitable metal is brought into direct surface contact with a semiconductor, an electronic barrier is formed in the semiconductor much like the barrier associated with a semiconductor P-N junction. This barrier is often called a Schottky barrier and the resulting diodes called Schottky diodes. When an electrical bias is applied between the semiconductor and the metal, non-ohmic conduction (i.e., rectification) occurs. The conduction will in fact vary with applied voltage magnitude and polarity in a fashion similar to that in a semiconductor P-N junction diode. When the applied voltage is poled so that the metal contact has the polarity of the majority carriers in the semiconductor, the carriers will be repelled and the barrier enhanced. Very little conduction will occur and the diode is considered reverse biased. When the applied voltage is so poled that the metal contact has the polarity opposite to that of the semiconductor majority carriers, the carriers are attracted to the metal and the barrier lowered. At relatively low voltage levels substantial conduction due to majority carriers is observed. There is no minority carrier injection and only majority carrier conduction is involved. These carriers surmount the barrier by virtue of applied voltage and are therefore known as "hot" carriers. Such hot-carrier operated diodes typically display substantial forward conduction at voltage levels considerably below that level needed by a semiconductor P-N junction to achieve the same current density.

Since minority carrier injection is absent, hot-carrier or Schottky diodes do not display the delayed turn-off characteristic of P-N junction diodes. Therefore, they can switch large current values much more rapidly, and thus they have the capability of high frequency operation.

In the reverse bias direction, the barrier blocks current flow and "leakage" is ordinarily quite low. In theory the device should not break down electrically until the applied voltage has risen to the semiconductor avalanche level. In practice it has been found that the periphery of the metal contact induces field-enhanced breakdown at a much lower than expected voltage. The mechanism for this effect is not well understood, but it has been found that if the metal contact terminates over a P-N junction, the diode breakdown will more closely approach the avalanche level. Accordingly, it is standard practice to incorporate a P-N junction in the form of a guard ring around the entire periphery of the metal contact. In the forward bias direction, such a junction is largely inactive because the metal-semiconductor hot-carrier conduction prevents the bias from rising to a level that will produce forward P-N junction conduction. Thus, in the forward direction, diode action is limited to the area inside the P-N junction ring. In the reverse bias direction the diode includes the area under the P-N junction, as well as that under the metal contact.

From the foregoing, it is clear that the frequency of operation and forward conduction requirements establish the required Schottky barrier or metal contact area. To avoid adding excess reverse bias diode capacitance, the P-N junction guard ring area is kept as small as feasible. As a practical matter for most low frequency diode applications, the size of the guard ring does not constitute much of a problem. However, at the higher frequencies its effect becomes more pronounced. For example, in the photolithographic fabrication art, the smallest feasible linewidth is about 0.1 mil for conventional processing. Thus, the smallest practical guard ring width is about 0.1 mil. To operate effectively in the X-Band it has been found that a Schottky diode diameter of 0.35 to 0.45 mil is required. In the $K_u$-Band a diode diameter of 0.20 to 0.25 mil is required. If a guard ring is added to the X-Band diode, the contact diameter is increased to 0.55 to 0.65 mil. Such a contact diameter has sufficient capacitance to limit useful performance to about the S-Band. To make a guard ring structure operative in the X-Band, the effective Schottky barrier diameter must be reduced to 0.15 to 0.25 mil, and this means the guard ring area is as large, or larger than the useful diode contact area. It is clear that a guard ring narrower than 0.1 mil is required if such diodes are to be useful in the X-Band and higher frequencies. This tends to preclude using photolithographic guard ring fabrication in diodes operating above S-Band.

SUMMARY OF THE INVENTION

It is an object of the invention to fabricate Schottky barrier diode guard rings without using photolithographic delineation thereof.

It is a further object to facilitate Schottky barrier diode guard ring fabrication on very small diode structures.

It is a still further object to employ a doped oxide in the fabrication of Schottky diode guard rings.

It is a still further object to fabricate Schottky diode guard rings in microwave structures while reducing conventional process complexity.

These and other objects are achieved in the following process. A high conductivity N-type substrate is provided with a conventional surface oxide. This oxide is then overlaid with a separate layer of boron doped glass, or the upper portion of the oxide can be boron doped during oxide formation. In either case, the oxidized wafer has a conventional oxide layer with a boron doped upper surface. Holes are photolithographically etched into the oxide to expose the underlying semiconductor. These holes have a diameter only slightly larger than the desired Schottky barrier diameter. The wafer is then exposed to vapor phase epitaxial semiconductor deposition. Due to the nature of the process, N-type semiconductor material will grow only on the exposed semiconductor substrate. The deposited material is chosen to have a resistivity suitable for Schottky barrier formation. Deposition is continued to just fill the holes in the oxide. Therefore, the uppermost portion of the epitaxial deposit will be in contact with the boron doped glass, and, by diffusion, will be doped P-type.

Thus, by the practice of this invention, a narrow P-type ring will surround the N-type material surface, and its production is an automatic by-product of epitaxial semiconductor growth. No separate operation is needed, and the process is greatly simplified. When the metal contact is subsequently deposited over the diode the Schottky barrier is formed on the deposited semiconductor surface, and the barrier is surrounded by a very narrow P-N junction. Significantly, the width of the guard ring is no longer limited by the nature of the photolithographic process.

DETAILED DESCRIPTION OF THE PRIOR ART PROCESS

Figure 1:
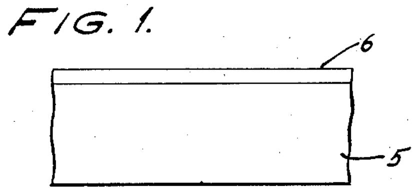
FIGS. 1 through 6 show the process steps employed in the typical prior art process.

FIGS. 1 through 6 detail the typical prior art process for making small-area low-capacitance Schottky diodes. The starting material is an N+ silicon wafer 5 of about 0.001 ohm centimeter resistivity. An N-type layer 6 having about 0.3 ohm centimeter resistivity is epitaxially deposited, by well known process means, over the entire wafer as shown in FIG. 1.

It should be emphasized that all of the figures are designed to detail the process and are not drawn to scale. Also, while only a single diode will be described and shown in process, in commercial practice many such diodes will be fabricated simultaneously on a single semiconductor wafer. After completing the processing steps that will be illustrated, the wafer, containing possibly thousands of such diodes, will be separated into individual elements which will then be separately packaged for use.

Figure 2:
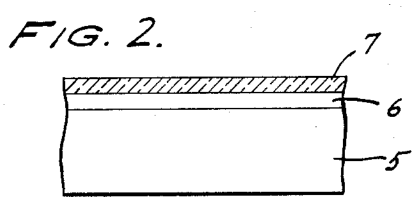

As shown in FIG. 2, an oxide layer 7 is grown over the entire wafer. Typically, this will be accomplished in a well-known high-temperature process in which the wafer is exposed to an oxygen-containing atmosphere. This causes an oxide layer to grow directly on the silicon surface.

Next, the diode guard ring pattern is established using the conventional photolithographic process. The term photolithography is used in this specification to denote light pattern controlled selective chemical etching. While the term and conventional process are well known, the following description is intended to be representative of the process employed in practicing the invention, as well as the prior art.

The surface to be treated is first coated with a photoresist. This is a material which will protect the surface from etching solutions. The resist is applied in liquid form to the surface to be treated and then dried by solvent evaporation, leaving a light sensitive solid coating. The resist is subjected to a pattern of light, and then developed in a chemical solvent that will remove unhardened portions. Where the resist has been removed, the exposed surface can be acted upon by a chemical etchant portions thereof removed. Where the resist remains, the etchant cannot attack the surface. By this means the etchant action is controlled or localized by means of a light pattern.

Two kinds of photosensitivity are found in resists. In the negative resist the action of light hardens it so that upon development the unexposed resist is removed. The subsequent etching operation will remove surface material from those regions where the light pattern did not impinge. In the positive resist the action of light is to render the resist soluble in the developer solution. After development the resist remains where light did not impinge, and these areas will be protected while the rest of the surface will be removed during the etching operation. Either form of resist can be used in practicing the invention. The nature of the resist determines whether a positive or negative light pattern will be employed in the exposure operation. After the etching operation is completed, the resist is completely removed by chemical or thermochemical means.

Figure 3:
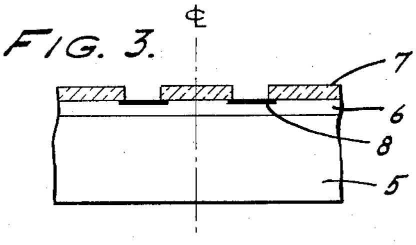

The guard ring pattern, shown in FIG. 3, is photolithographically etched through oxide layer 7, using a fluoride ion containing solution that will dissolve the oxide, but not the underlying silicon. It will be understood that, in all the cross section drawings, the devices described are circularly symmetrical about a center line such as that shown in dashed lines in FIG. 3. Thus, the opening in oxide layer 7 is that of a single ring or annulus and not that of two circular holes. Then the wafer is exposed to P-type impurity atoms in a well known high temperature diffusion process. This creates a P-type region or ring 8 in the semiconductor just under the opening previously cut into the oxide layer.

Figure 4:
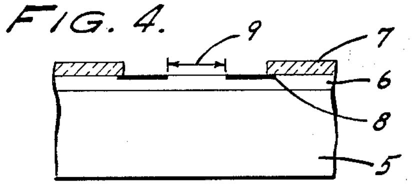

Using a second photolithographic etching process, a hole is etched through the oxide so that its outer periphery is in registry with the outer periphery of the guard ring 8. This exposes the area 9 inside the guard ring (as shown in FIG. 4). This step also removes any oxide from the guard ring that might be left after the guard ring diffusion step.

At this point, Schottky barrier metal contacts could be deposited. However, the so-called thick glass process will be detailed. This approach produces diodes having reduced parasitic shunt capacitance, and is greatly preferred for microwave diode fabrication.

Figure 5:
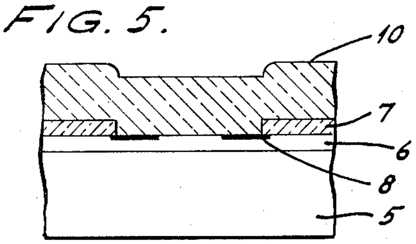

As shown in FIG. 5, a relatively thick layer 10 of vapor deposited oxide is applied to the wafer. A well known pyrolytic gas plating process is used to deposit either silicon dioxide, or as preferred, a low-stress mixture of silicon phosphorous and phorphorous oxide. This layer is made several times as thick as oxide layer 7.

Figure 6:
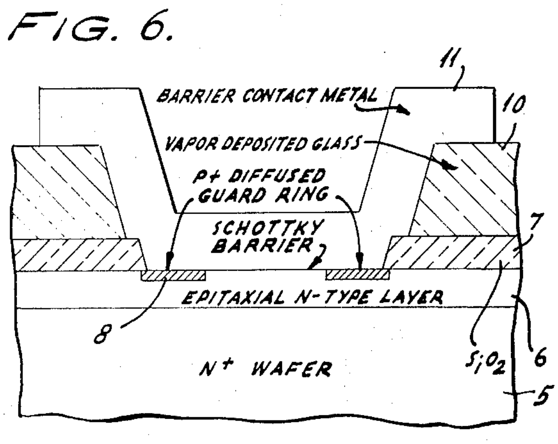

A contact hole is then photolithographically etched through the vapor oxide layer 10 in registry with the outer periphery of the guard ring 8. Vapor deposited oxide etches much more rapidly than does a grown oxide layer. Accordingly, this etching step does not need to be precise because layer 7 acts to define the contact hole precisely and to prevent the outer guard ring periphery from being exposed. The vapor glass over the barrier region 9 is completely removed so that when a Schottky metal contact layer is deposited over the wafer, it contacts all of the barrier region and the inner portion of the guard ring 8 as shown in FIG. 6. The metal contact is then photolithographically etched to confine it to the active diode region as shown by contact 11 of FIG. 6. It will be noted that where contact 11 is not in direct contact with the semiconductor surface, it is spaced away from the surface by a substantial thickness of oxide. This reduces the parasitic contact capacitance to a very low value. Further details on this low capacitance contact structure can be found in copending application 6,362 filed Jan. 28, 1970.

Since one of the critical steps in the foregoing process is the photolithographic production of the guard ring, it is clear that the minimum width of the ring will be limited by the capability of the fabrication system. A 0.1 mil minimum line width value is typical of the photolithographic art. For diode electrodes of one mil and larger, no problem exists. However, at the microwave frequencies diode contacts may be in the fractional mil range and a 0.1 mil guard ring comprises an excessive value.

For a Schottky diode designed to operate in the X-Band, a contact diameter of about 0.4 mil is required. A 0.1 mil guard ring increases the electrode diameter to 0.6 mil, which will not operate efficiently much above the S-Band. It can be seen that the smallest guard ring that can be achieved will have an area as large, or larger than that of the useful Schottky barrier at the X-Band.

Another problem, that is associated with the use of diffusion, is the control of depth or penetration. To keep diode series resistance as small as possible, the thickness of the epitaxial layer 6 is kept small. Desirably, layer 6 will be about 1.5 microns thick. When ring 8 is being diffused, it is difficult to control the process to avoid complete penetration of the layer. When penetration occurs, the diode is effectively shorted.

Thus, the prior art process leaves much to be desired in the fabrication of higher frequency microwave diodes. The following process avoids these shortcomings.

DETAILED DESCRIPTION OF THE INVENTION

Figure 7:
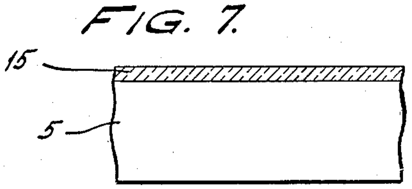
FIGS. 7 through 11 show the process steps of the invention.
Figure 8:
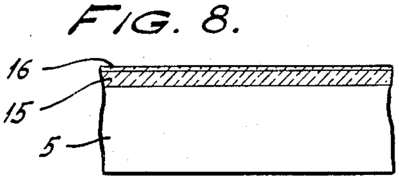

In the process of the invention the starting wafer is the same as shown in the prior art, an N+ wafer of about 0.001 ohm centimeter resistivity. As shown in FIG. 7, the wafer 5 is covered by a conventional grown oxide layer 15. Either during the last portion of oxide growth or subsequent thereto, the wafer is heated in an atmosphere containing a P-type dopant such as boron oxide. This results in a boron doped layer 16 as shown in FIG. 8.

A hole is photolithographically etched through the oxide layer down to the N+ wafer surface. This step is of minimal precision and no registry is required. The hole should be only slightly larger than the desired Schottky diode diameter. The wafer is then subjected to the epitaxial semiconductor growth process. The nature of the process is such that the deposition is confined to the exposed semiconductor. The oxide surface will not nucleate the crystal growth and any formations that develop on the oxide will not be coherent. This characteristic of epitaxial crystal growth is taught and claimed in U.S. Pat. No. 3,265,542. The growth process is continued until the deposit 17 just fills the hole in the oxide as shown in FIG. 9.

Figure 9:
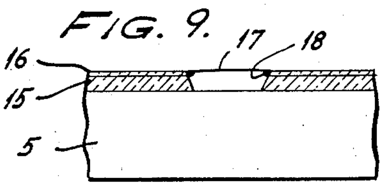

During the portion of epitaxial growth when the deposit has reached the level of layer 16, boron from the oxide coating will enter into the periphery of the top of the epitaxial deposit to produce a P-type guard ring 18 as shown in FIG. 9. Since the conventional epitaxial growth temperature is substantially below the temperature normally used for diffusion, very little actual diffusion will occur. Furthermore, the time required to grow the epitaxial deposit past layer 16 is quite short in relation to conventional diffusion times. Consequently ring 18 is extremely narrow, and is confined exclusively to the periphery of the upper portion of the epitaxial deposit. Significantly, by the practice of the process of this invention, the guard ring 18 is established automatically or as a by-product of the epitaxial formation of deposit 17.

Figure 10:
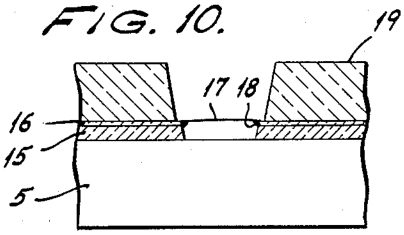
Figure 11:
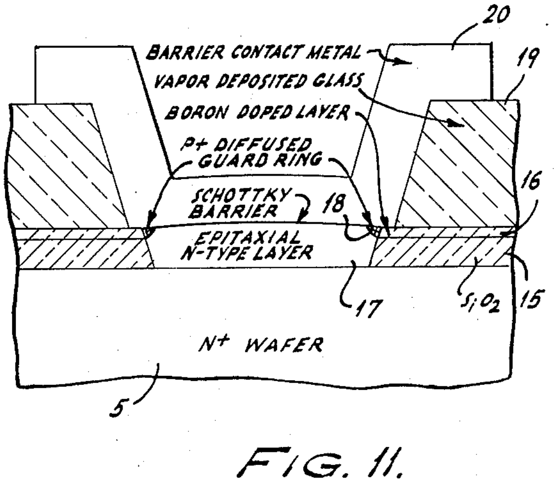

As shown in FIG. 10, the wafer is covered by a thick layer of vapor deposited oxide 19, preferably a mixture of $SiO_2$ and phosphorous oxide, and a contact hole is etched therein in registry with the epitaxial deposit 17. If desired the same photolithographic light exposure mask used to establish the oxide hole for the epitaxial deposit can be used for the contact hole etching. Then a Schottky barrier metal is deposited over the wafer and photolithographically delineated to produce the metal contact 20 of FIG. 11.

It can be seen that guard ring is made very shallow and narrow. It is automatically aligned with diode periphery, thereby eliminating at least one photolithographic process step, and its requirement for precision orientation. The narrow guard ring makes the fabrication of X-Band and higher frequency microwave Schottky diodes feasible. The shallow guard ring feature reduces the possibility of short-through even for diodes made on very thin epitaxial layers. This means that diodes having relatively low series resistance can easily be fabricated.

While the above-description shows a preferred process for fabricating suitable diodes, modifications will occur to persons skilled in the art. Accordingly, it is intended that the invention will be limited only by the following claims.

I claim:

1. A process for fabricating Schottky barrier diodes comprising the steps:

a. providing a high conductivity semiconductor wafer, b. growing an oxide layer on said wafer, c. depositing a conductivity type determining compound capable of imparting semiconductor conductivity of a type opposite to that of said wafer on the surface of said oxide layer, d. etching a hole through said oxide, e. depositing epitaxial semiconductor material in said hole to a depth sufficient to cause said conductivity type determining compound to contact said epitaxial material circumferentially, said epitaxial material having a conductivity type the same as that of said wafer and having a conductivity value required for said diodes, and f. depositing Schottky barrier forming metal contact to cover said epitaxial material deposit.

2. The process of claim 1, wherein said wafer of step (a) is N-type silicon, and said compound of step (c) is a boron compound.

3. The process of claim 1, wherein said process further includes the steps comprising:

covering said wafer, subsequent to depositing said epitaxial material, with an insulating coating that is thick relative to said oxide layer; and etching a hole in said insulating coating in registry with said hole of step (d).

4. The process of claim 3, wherein said insulating coating comprises a mixture of vapor deposited silicon oxide and phosphorous oxide.

* * * * *